(12) United States Patent
Zarrineh et al.

(10) Patent No.: US 7,178,076 B1
(45) Date of Patent: Feb. 13, 2007

(54) ARCHITECTURE OF AN EFFICIENT AT-SPEED PROGRAMMABLE MEMORY BUILT-IN SELF TEST

(75) Inventors: Kamran Zarrineh, Billerica, MA (US); Seokjin Kim, Bedford, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 253 days.

(21) Appl. No.: 10/869,720

(22) Filed: Jun. 16, 2004

(51) Int. Cl.
*G01R 31/28* (2006.01)

(52) U.S. Cl. .................. 714/733; 714/720; 714/30; 365/201

(58) Field of Classification Search .............. None
See application file for complete search history.

(56) References Cited

U.S. PATENT DOCUMENTS

| | | | |
|---|---|---|---|
| 5,450,586 A | 9/1995 | Kuzara et al. ............... 395/700 |
| 5,600,790 A | 2/1997 | Barnstijn et al. ......... 395/183.14 |
| 5,640,542 A | 6/1997 | Whitsel et al. ............. 395/500 |
| 5,691,990 A | 11/1997 | Kapur et al. ............... 371/22.3 |
| 5,715,387 A | 2/1998 | Barnstijn et al. ......... 395/183.14 |
| 5,809,293 A | 9/1998 | Bridges et al. ............. 395/568 |
| 5,893,009 A | 4/1999 | Yamada ....................... 399/44 |
| 5,923,675 A | 7/1999 | Brown et al. ............. 371/22.31 |
| 5,930,814 A | 7/1999 | Lepejian et al. ............... 711/1 |
| 5,974,579 A | 10/1999 | Lepejian et al. ............ 714/733 |
| 5,995,731 A | 11/1999 | Crouch et al. ......... 395/500.05 |
| 6,067,262 A | 5/2000 | Irrinki et al. ............... 365/201 |
| 6,094,730 A | 7/2000 | Lopez et al. .................. 714/28 |
| 6,105,125 A * | 8/2000 | Nemirovsky et al. ....... 712/209 |
| 6,272,588 B1 | 8/2001 | Johnston et al. ............ 711/106 |
| 6,286,116 B1 | 9/2001 | Bhavsar ..................... 714/720 |
| 6,289,300 B1 | 9/2001 | Brannick et al. ............. 703/28 |
| 6,367,042 B1 | 4/2002 | Phan et al. ................. 714/733 |
| 6,405,331 B1 | 6/2002 | Chien ........................ 714/718 |
| 6,415,403 B1 | 7/2002 | Huang et al. ............... 714/726 |
| 6,424,583 B1 | 7/2002 | Sung et al. ................. 365/201 |
| 6,505,317 B1 | 1/2003 | Smith et al. ................ 714/738 |
| 6,557,127 B1 | 4/2003 | Adams et al. .............. 714/718 |
| 6,560,740 B1 * | 5/2003 | Zuraski et al. .............. 714/733 |
| 6,574,590 B1 | 6/2003 | Kershaw et al. ............. 703/28 |
| 6,605,988 B1 | 8/2003 | Gauthier et al. ............ 327/541 |
| 6,651,201 B1 * | 11/2003 | Adams et al. .............. 714/733 |
| 6,651,202 B1 | 11/2003 | Phan ......................... 714/733 |
| 6,667,918 B2 | 12/2003 | Leader et al. ............... 365/201 |
| 6,668,347 B1 | 12/2003 | Babella et al. ............. 714/733 |
| 6,681,350 B2 | 1/2004 | Adams et al. .............. 714/718 |
| 6,700,946 B2 | 3/2004 | Zarrineh et al. .............. 377/44 |
| 6,996,760 B2 * | 2/2006 | Dorsey ....................... 714/733 |
| 2003/0120974 A1 * | 6/2003 | Adams et al. ................ 714/31 |
| 2004/0107396 A1 * | 6/2004 | Barone et al. ............. 714/733 |
| 2004/0230395 A1 * | 11/2004 | Basto ........................ 702/117 |

OTHER PUBLICATIONS

Zarrineh et al., "On Programmable Memory Built-In Self Test Architectures", IEEE, Mar. 12, 1999, pp. 708-713.*

* cited by examiner

*Primary Examiner*—Albert Decady
*Assistant Examiner*—John P. Trimmings
(74) *Attorney, Agent, or Firm*—Dorsey & Whitney LLP

(57) ABSTRACT

A method of testing an embedded memory at speed within an integrated circuit which includes providing a memory built in self test sequencer module, providing a satellite engine module coupled to the memory built in self test sequencer module and applying a march test to the embedded memory via the satellite engine module based upon information stored within the instruction buffer. The satellite engine module includes an instruction buffer and a sequence generation engine.

16 Claims, 8 Drawing Sheets

ARCHITECTURE OF AN EFFICIENT AT-SPEED PROGRAMMABLE MEMORY BUILT-IN SELF TEST

BACKGROUND OF THE INVENTION

1. Field of the Invention

The present invention relates to processors having embedded memories and more particularly to exposing and debugging defects within embedded memories of processors.

2. Description of the Related Art

Digital systems, such as microprocessors, include data paths, control paths and memories. Many known digital systems include embedded memories. One challenge associated with embedded memories relates to identifying defects within the embedded memory. Defects in memories may be due to shorts and opens in memory cells of the embedded memories, address decoder(s) and read/write logic. These defects may be modeled as Stuck-at Faults (SAF), Transition Faults (TF), Stuck Open Faults (SOF), Address Decoder Faults (AF), Coupling Faults (CF) and Neighborhood Pattern Sensitive Faults (NPSF) in the memory cells.

A plurality of classes of test algorithms have been proposed for detection of the memory faults. The plurality of classes of test algorithms include deterministic test algorithms, pseudo random test algorithms and pseudo exhaustive test algorithms. A known deterministic test algorithm is a march test algorithm. A march test algorithm involves applying a finite sequence of march elements to each cell in the memory in either ascending or descending order before proceeding to the next memory cell. Different types of march tests are used to detect faults in single-port memories and recently in multi-port memories have been proposed.

The memory test algorithms can be applied to the memory under test via memory testers. Testing via a memory tester involves providing a test bus from the input/output pins of the memory to the boundary of the integrated circuit in which the memory is embedded. Testing via a memory tester has known drawbacks including the wiring overhead of the test bus to access the memory under test and the cost of memory testers. Advantages of testing via a memory tester include the level of controllability and observability on the memory under test and the fact that the memory under test is tested at speed or at the speed that the I/O can allow it. To overcome the wiring overhead, serial-to-parallel interfaces have been included within an integrated circuit in which memory is embedded. Thus, the test bus is reduced in width; however, the delay for serial-to-parallel conversion becomes a bottle neck for at speed memory test.

A typical high performance microprocessor has approximately 100–150 embedded memories. Considering the complexity of these devices and the fact that the Input/Output (I/O) connections of the microprocessors are much slower than their core clock rate, the external tester method is often an ineffective and inefficient method to test the memories embedded within large scale integrated circuits such as microprocessors.

A known method for testing embedded memories is by providing an embedded memory built in self test (MBIST) module to apply memory test patterns to the embedded memories. An MBIST module includes different components including a memory BIST controller. The memory BIST controller realizes the memory test algorithm. Known memory BIST controllers have been designed as Finite State Machine (FSM) based controllers or as microcode-based controllers. The FSM based memory BIST controller is efficient but lacks the flexibility necessary to accommodate changes in a memory test algorithm. The ability to change the memory test algorithm is desirable for devices fabricated using new technologies as well as debugging a field return part. Microcode-based controllers are flexible and can apply different test algorithms. However, the efficiency and effectiveness of a microcode based controller depends on the architecture of the controller.

Regardless of the capabilities of the memory BIST module, it is desirable for the memory BIST module to be activated and for test algorithm to be customized in different levels of test, e.g., manufacturing-level, board-level and system-level test. This implies that the memory BIST module should be able to communicate with different interfaces using different protocols. Furthermore, the status of the test should be made available and should be readily extractable.

However, known programmable memory BIST architectures cannot be used as a part of system level test because the known memory BIST architectures have a high area overhead or cannot be run at speed.

Accordingly, it is desirable to provide a programmable memory BIST architecture that can be run in manufacturing level, board level and system level test environments, that can be realized with a low area overhead and that provides the flexibility to change the test algorithm on the test floor is desired.

SUMMARY OF THE INVENTION

In accordance with the present invention, an at speed programmable memory BIST module is disclosed. In the at speed programmable memory BIST module, a march test algorithm is divided into march test components. The programmable memory BIST module includes an engine module which is divided into an instruction buffer and a sequence generation module. The instruction buffer includes a set of parameters that specifies which march test component to execute while the sequence generation module realizes a march test component.

The invention relates to an architecture which provides an at speed programmable memory Built In Self Test by dividing a programmable memory BIST engine module into an instruction buffer and a sequence generation engine. The invention also relates to using a look ahead module to realize a true at speed test. The invention also relates to an instruction buffer rewinding module that allows a programmable memory BIST module to be reused once it is programmed. The invention also relates to providing a memory BIST engine module with an instruction buffer having the ability to initialize itself to an initial march test.

In one embodiment, the invention relates to a method of testing an embedded memory at speed within an integrated circuit which includes providing a memory built in self test sequencer module, providing satellite engine module coupled to the memory built in self test sequencer module and applying a march test to the embedded memory via the satellite engine module based upon information stored within the instruction buffer. The satellite engine module includes an instruction buffer and a sequence generation engine.

In another embodiment, the invention relates to a programmable memory built in self test apparatus for testing an embedded memory at speed within an integrated circuit which includes a memory built in self test sequencer module and a satellite engine module coupled to the memory built in self test sequencer module. The satellite engine module includes an instruction buffer and a sequence generation engine. The satellite engine module applies a march test to the embedded memory based upon information stored within the instruction buffer.

In another embodiment, the invention relates to a programmable memory built in self test apparatus for testing a plurality of embedded memories at speed within an integrated circuit which includes a memory built in self test sequencer module and a plurality of satellite engine modules coupled to the memory built in self test sequencer module and to the plurality of embedded memories. Each of the plurality of satellite engine modules includes an instruction buffer and a sequence generation engine. Additionally, each of the plurality of satellite engine modules applies a march test to a respective embedded memory based upon information stored within the instruction buffer.

In another embodiment, the invention relates to a processor which includes a plurality of functional units and a programmable memory built in self test module for testing the respective embedded memory. Each of the functional units includes a respective embedded memory. The programmable built in self test module includes a memory built in self test sequencer module and a plurality of satellite engine modules coupled to the memory built in self test sequencer module and to a respective embedded memory. Each of the plurality of satellite engine modules includes an instruction buffer and a sequence generation engine. Additionally, each of the plurality of satellite engine modules applies a march test to the respective embedded memory based upon information stored within the instruction buffer.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
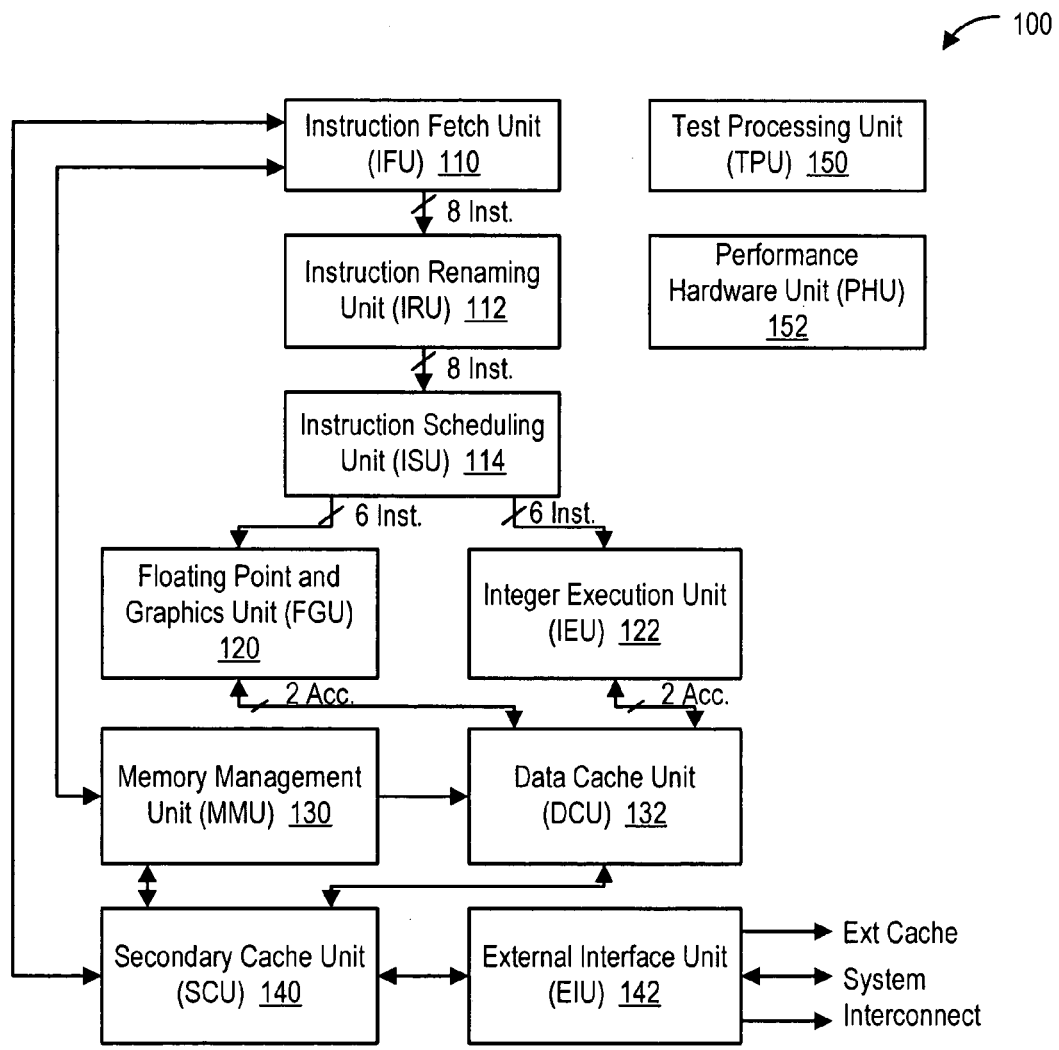
FIG. 1 shows a schematic block diagram of a multithreaded processor architecture.

FIG. 1 shows a schematic block diagram of a multithreaded processor architecture. More specifically, processor 100 includes an instruction fetch unit (IFU) 110, an instruction renaming unit (IRU) 112, an instruction scheduling unit (ISU) 114, a floating point and graphics unit (FGU) 120, an integer execution unit (IEU) 122, a memory management unit (MMU) 130, a data cache unit (DCU) 132, a secondary cache unit (SCU) 140, an external interface unit (EIU) 142.

The processor also includes a test processing unit (TPU) 150 and a performance hardware unit (PHU) 152.

The instruction fetch unit 110 includes an instruction cache and branch prediction logic. The instruction fetch unit 110 is coupled to the instruction renaming unit as well as to the memory management unit 130 and the secondary cache unit 140.

The instruction renaming unit 112 is coupled to the instruction fetch unit 110 and to the instruction scheduling unit 114. The instruction renaming unit 112 includes dependency check logic and a helper instruction generator.

The instruction scheduling unit 114 is coupled to the floating point and graphics unit 120 and to the integer execution unit 122. The instruction scheduling unit 114 includes an instruction window module.

The floating point and graphics unit 120 is coupled to the instruction scheduling unit 114 and data cache unit 132. The floating point and graphics scheduling unit 120 includes floating point and graphics execution units, a floating point register file and a floating point and graphics result buffer.

The integer execution unit 122 is coupled to the instruction scheduling unit 114 and to the data cache unit 132. The integer execution unit 122 includes integer execution units, an integer register file and virtual address adders.

The memory management unit 130 is coupled to the instruction fetch unit 110, to the data cache unit 132, and to the secondary cache unit 140. The memory management unit 130 includes a virtual address to physical address translation module as well as a translation lookaside buffer.

The data cache unit 132 is coupled to the floating point and graphics unit 120, to the integer execution unit 122 and to the secondary cache unit 140. The data cache unit 132 includes a data cache and a memory disambiguation buffer.

The secondary cache unit 140 is coupled to the memory management unit 130, the data cache unit 132 and the external interface unit 142. The secondary cache unit 140 includes a memory scheduling window as well as a unified L2 (level 2) cache.

The external interface unit 142 is coupled to the secondary cache unit 140 as well as to an external cache and the system interconnect. The external interface unit 142 includes a transaction scheduling window, an external cache controller and an I/O system interconnection controller.

The test processing unit 150 is coupled to various units across the processor 100. The test processing unit 150 includes a power on controller as well as a clock controller.

The performance hardware unit 152 is coupled to various units across the processor 100. The performance hardware unit includes performance instrumentation counters as well as a sampling mechanism.

The instruction fetch unit 110 is responsible for fetching instructions from the instruction cache and then sending the resulting bundles of instructions to the instruction renaming unit 112. The instruction fetch unit may fetch up to eight instructions per cycle. Each group of instructions delivered by the instruction fetch unit is referred to as a fetch bundle. The instruction cache sources instructions to the processor pipeline by accessing a local instruction cache with predetermined cache indices. The instruction is virtually addressed by an instruction pointer generator. The branch prediction logic enables the instruction fetch unit 110 to speculatively fetch instructions beyond a control transfer instruction (CTI) even though the outcome or target of the control transfer instruction is not yet known.

The instruction renaming unit 112 decodes instructions, determines instruction dependencies and manages certain processor resources. The instruction scheduling unit 114 scheduling instructions from each thread for execution, replays instructions that are consumers of loads when the load misses in the data cache, maintains completion and trap status for instructions executing within the processor 100 and separately retires instructions in fetch order from each thread.

The floating point and graphics unit 120 implements and executes floating point instructions and graphics instructions. The integer execution unit 122 implements and executes fixed point integer instructions. Additionally, the integer execution unit 122 assists in execution of floating point instructions which depend on integer condition codes, integer registers and floating point condition codes.

The memory management unit 130 performs virtual address to physical address translation and includes a translation lookaside buffer that provides a translation for the most frequently accessed virtual pages.

The data cache unit 132 provides the main interface between execution pipelines and memory within the processor 100. The data cache unit 132 executes load and store instructions as well as derivatives of load and store instructions. The data cache unit 132 provides a first level cache that is coupled directly to the execution units. The memory disambiguation buffer dynamically disambiguates memory addresses to enable execution of out of order instructions.

The secondary cache unit 140 provides a unified L2 cache. The L2 cache is controlled by the memory scheduling window which tracks accesses that miss in the L1 caches, the MMU and snoop system request. The memory scheduling window provides an interface between the instruction fetch unit and the L2 cache. The memory scheduling window also receives snoops from the external interface unit 142 and retired stores from the data cache unit 132.

The external interface unit 142 controls data flow among the L2 cache and the external cache, controls system interconnect, provides external cache control and provides a common interface for external processors, I/O bridges, graphics devices, and memory controllers.

The test processing unit 150 performs power on tests as well as diagnostic accesses within the processor 100. The test processing unit 150 provides clock control, reset, power-on, self-test, manufacturing test, design for testability and access to external interfaces.

The performance hardware unit 152 uses the performance instrumentation counters to gather aggregate information about various performance events across a plurality of instructions. The sampling mechanism gathers more detailed instruction history for specific executions of a sampled instruction.

Figure 2:
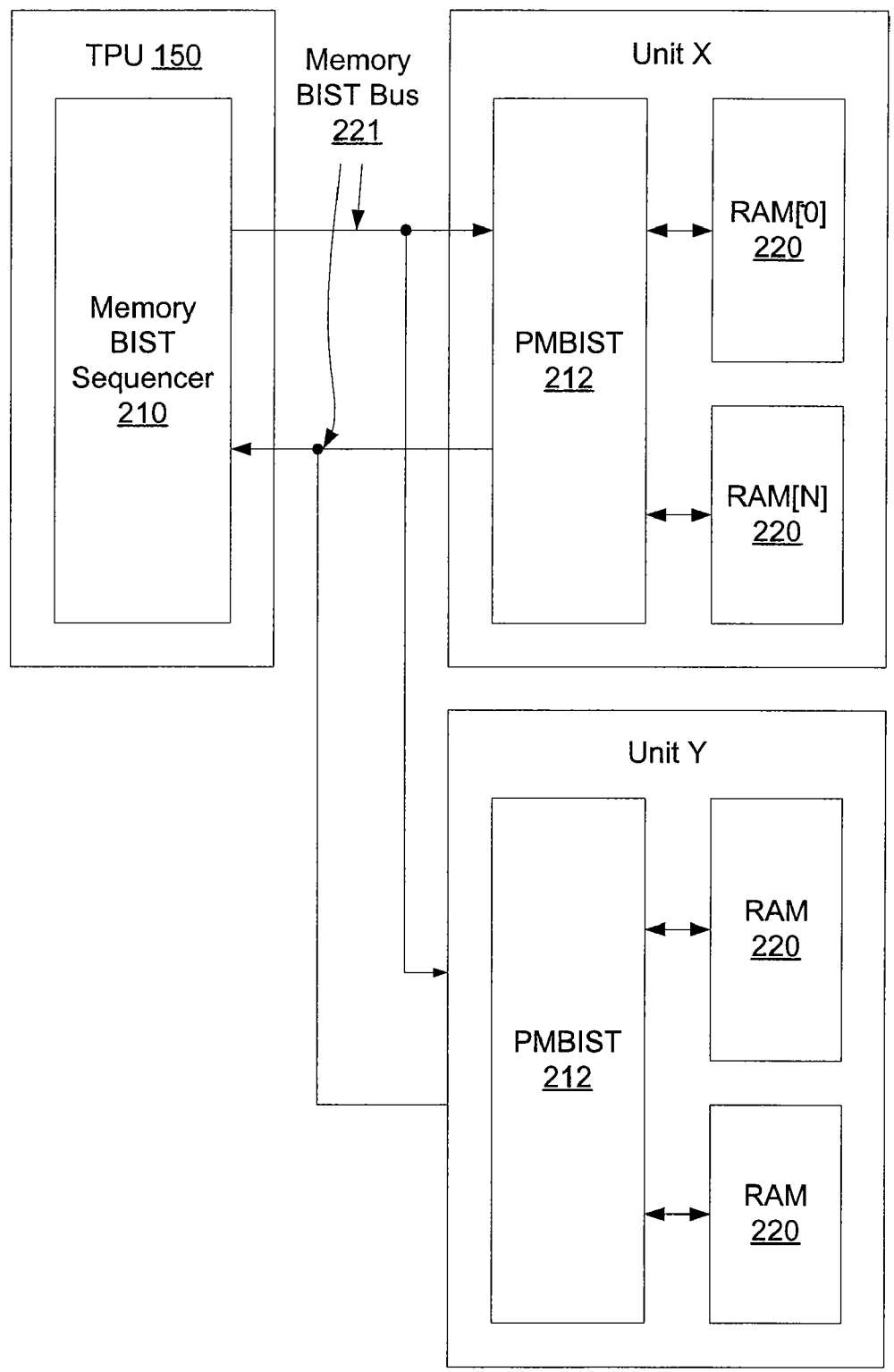
FIG. 2 shows a block diagram of a memory built in self test (BIST) system.

Referring to FIG. 2, a block diagram of a programmable memory BIST 200 is shown. The programmable memory BIST 200 includes at least two separate modules, memory BIST sequencer module 210 and a programmable memory BIST Engine (PMBST) 212. Each unit with the processor that includes memory to be tested by the memory BIST 200 includes a corresponding BIST engine module 212. The sequencer module 210 and the engine module 212 communicate via a memory BIST bus 221. The width of the memory BIST bus 221 may be upwards of 11 bits wide to test a block with only one memory or multiple memories in parallel. Additional signals could be added to schedule the test of multiple memories in a functional unit. In one embodiment, the memory BIST bus 221 is time multiplexed with an observability bus, which is a functional bus not relevant to the functioning of the embedded memory under test.

The memory BIST Sequencer module 210 resides inside the test processing unit 150 and functions as an interface between an external tester/service processor and the programmable memory BIST module 212. The memory BIST Sequencer module 210 activates the programmable memory BIST module 212 to run on a specific memory, checks the status of the programmable memory BIST module 212, collects error data as well as controls charge retention test time.

The programmable memory BIST engine module 212 realizes a memory test algorithm and applies the patterns to a memory under test. The programmable memory BIST engine module 212 generates a sequence of read and write operations of different data polarity; traversing the address space of the memory in an upward order (address 0 to $2^n-1$) or in a downward order (address $2^n-1$ to 0). The programmable memory BIST engine module 212 also communicates any failures in the memory under test to the memory BIST sequencer module 210 as well as sending status information to the memory BIST sequencer module 210.

Figure 3:
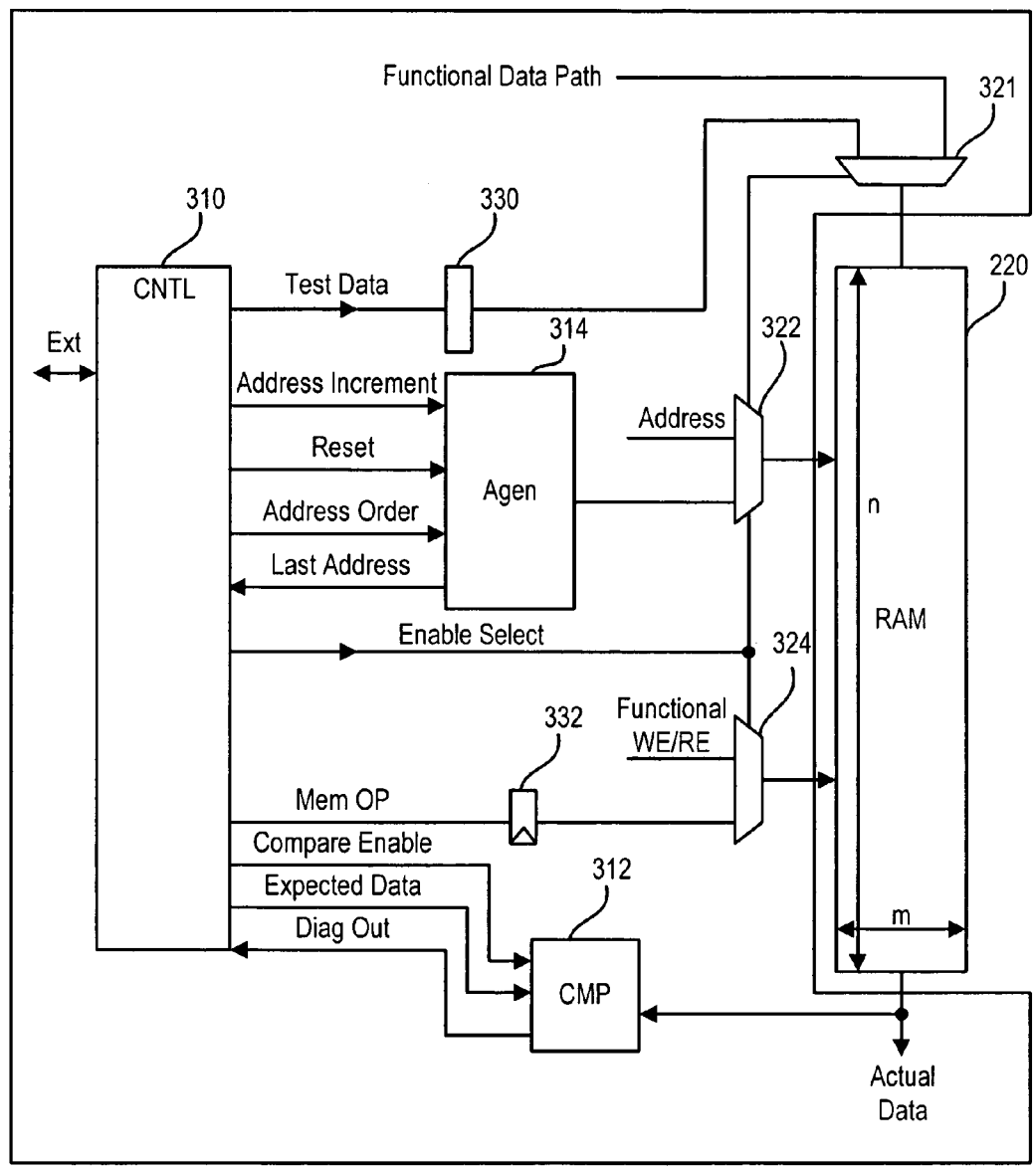
FIG. 3 shows a block diagram of a memory BIST engine module.

Referring to FIG. 3, a block diagram of the programmable memory BIST engine module 212 is shown. The programmable memory BIST engine module 212 is coupled to and tests a memory 220. The programmable memory BIST engine module 212 includes a controller 310, a comparator 312 and an address generator 314. The programmable memory BIST engine module 212 also includes multiplexers 321, 322 and 324 as well as gates 330 and 332. It will be appreciated that a single programmable memory BIST engine module 212 could test a plurality of memories. Alternately, it will be appreciated that a single controller 310 could be coupled to a plurality of comparators 312 and address generators 314 to test a respective plurality of memories 220.

The controller 310 is coupled to the comparator 312 and the address generator 314. The controller is also coupled to gates 330 and 332. More specifically, the controller 310 provides a test data signal to gate 330. Gate 330 in turn provides the signal to the multiplexer 321. The controller 310 provides an address increment signal and a reset signal to the address generator 314 and receives a last address signal from the address generator 314. The address generator 314 provides a test address signal to multiplexer 322. The controller 310 provides a compare enable signal and an expected data signal to the comparator 312 and receives a diagnosis signal from the comparator 312. The comparator 312 also receives an input of actual data that is provided as an output by the memory 220. The controller provides a memory operation signal to gate 332, which in turn provides this signal to multiplexer 324. The controller 310 also provides an enable and select signal to the multiplexers 321, 322 and 324.

The enable signal enables the programmable memory BIST engine module 212 path to a memory under test. The select signal selects an array within the memory. The memory operation signal indicates a type of memory operation. The memory operation may be a read operation, a write operation or a no operation (NOOP). The test data signal provides various patterns of test data that are written to the memory under test.

The address increment signal causes the address generator 314 to increment to a next index. The reset signal indicates whether to reset the address generator 314. The last address signal provides an indication to the controller 310 of the last address generated by the address generator 314.

The compare enable signal enables the compare module 312. The expected data signal provides a set of expected data against which the compare module 312 compares the actual data received from the memory under test. The diagnosis signal provides an output to the controller 310 when the engine 212 is functioning in a diagnostic mode.

The address generator module 314 traverses the address space of the memory in UP or DOWN order. The address generator module 314 may be realized as a binary counter or a Linear Feedback Shift Register (LFSR) as long as the entire address space of the memory under test is traversed. The counter includes a capability to reset to an initial state and generates a last address signal when the counter reaches its last address count. A single address generator module may be used to generate test addresses for multiple memories; however, the module should be able to generate addresses in both ascending and descending order.

An address order signal determines the order that the address space of the memory is traversed. One implementation of the UP/DOWN address space traversal is XOR the output of the address generation module 314 with the address order signal. The reset signal clears the address generation module 314 and, thus, controls the duration of the last address signal being asserted. In addition, add signals from and to the control module 310 to and from address generation module 314 should be pipestaged such that the two modules function correctly. The generated test address is XORed with the address order and is provided to the memory under test. Also, the last address is generated to account for any pipeline stages between the address generator 314 and the controller 310.

The controller 310 generates a control signal to perform a read or write operation as well as generating the test data to be written to the memory 220 and providing the expected test pattern, i.e., the test pattern that is expected to be read from the memory 220 under test. Also, the controller 310 communicates with the address generation module 314 and the comparator modules 312 to set the test address and activates the comparison of the expected vs. actual data from the memory under test.

In the programmable memory BIST system, a march test algorithm is divided into march test components. An example of a march test algorithm is:

UP ($W_0$)
UP ($R_0$ $W_1$)
DN ($R_1$)

In the example march test, the order that the address space is traversed is {UP, DN} corresponding to 0 to $2^n-1$ and $2^n-1$ to 0 address space traversals, respectively. The operation {$W_{data}$, $R_{data}$} indicates the Write or Read operations that are performed on each memory cell where data={0, 1}.

The march test shown above can be divided into three march test components, an Address_Order($W_{data}$) component, an Address_Order($R_{data\_bar}$ $W_{data}$) component and an Address_Order($R_{data}$) Each march test component performs the operation(s) in parenthesis on each memory cell until the last address is reached. Accordingly, the programmable memory BIST engine module 212 includes parameters such as Address_Order, Data and the March Test component.

Figure 4:
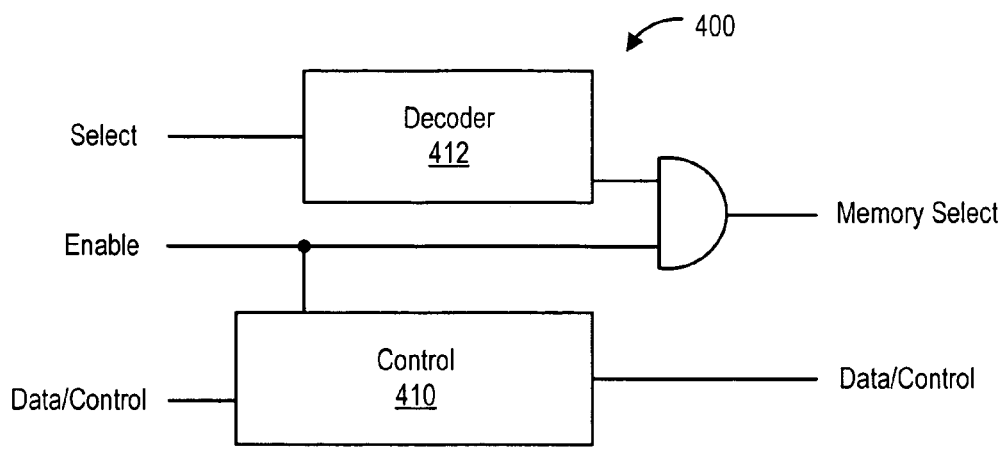
FIG. 4 shows a block diagram of the programmable memory BIST controller.

Referring to FIG. 4, a block diagram of a programmable Memory BIST global controller 400 is shown. The programmable Memory BIST Controller 310 in each unit includes an instantiation of a global memory BIST controller 410 and an optional decoder 412 if more than one memory is to be tested via the controller 310.

When present, the decoder decodes encoded select lines to select one memory within the unit to become the memory under test. The decoded select lines are ANDed with an enable signal. Thus, a memory under test is selected when the enable signal is asserted and the select lines are set appropriately.

Figure 5:
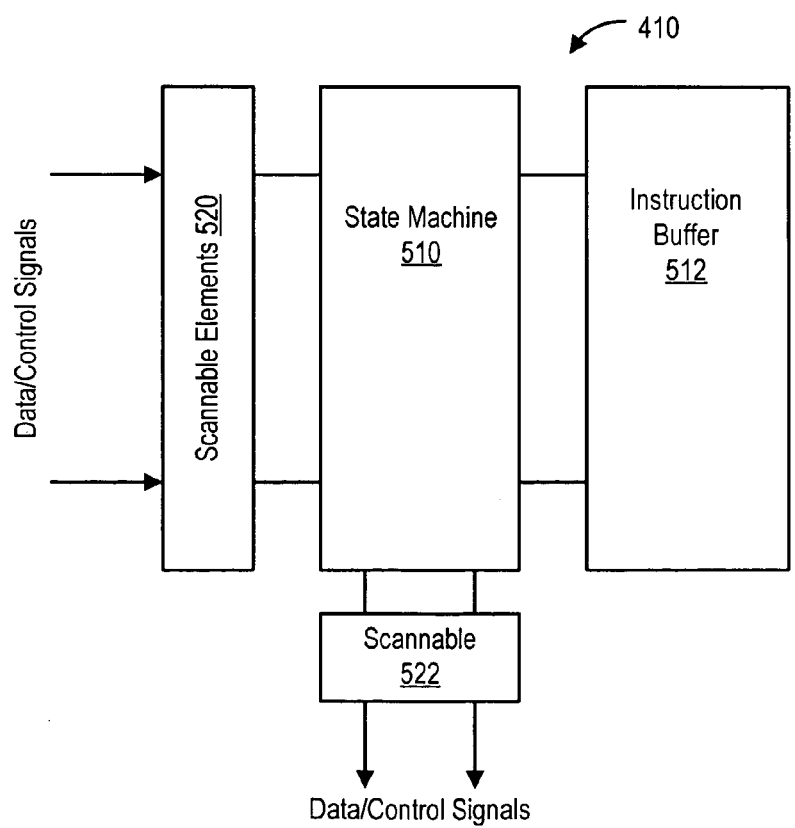
FIG. 5 shows a block diagram of a global programmable memory BIST controller.

Referring to FIG. 5, a block diagram of the global programmable memory BIST controller 410 is shown. The global programmable memory BIST controller 410 includes a control path state machine 510 and a data path instruction buffer 512 as well as an input scannable element module 520 and an output scannable element module 522. Data and control signals that are received by controller 410 are latched via the input scannable element module 520. Data and control signals that are provided by the controller 410 are latched by scannable element module 522. The instruction buffer 512 is 14 bits wide and 8 instructions deep. The instruction buffer could be implemented by scannable elements.

Figure 6:
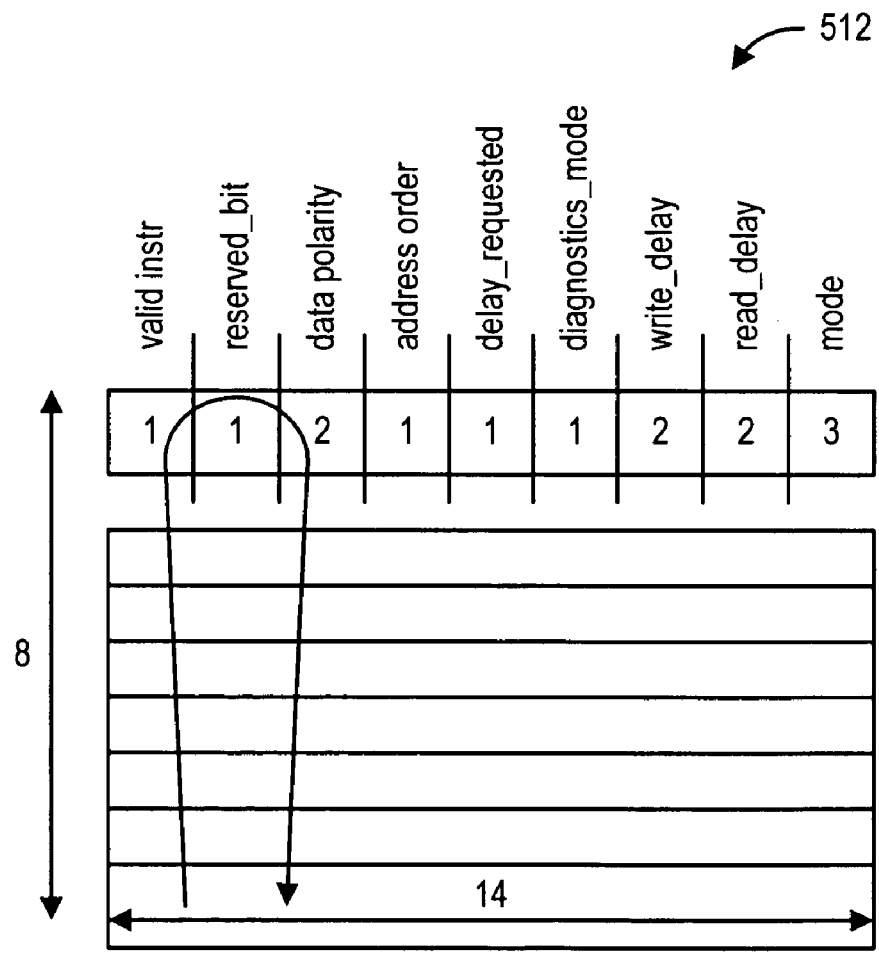
FIG. 6 shows an example of a sequence of instructions executing via a programmable memory BIST.

Referring to FIG. 6, a block diagram of the instruction buffer 512 as well as the width of each instruction field within the instruction buffer 512 is shown. Within the instruction buffer 512, each instruction includes a plurality of fields. More specifically, each instruction includes a 1-bit valid field that specifies whether the instruction is the last instruction that must be executed.

The state machine 510 uses two bits of the polarity field to generate blanket 0/1, stripe row, stripe column, checkerboard/checkerboard bar test patterns.

The write delay field and the read delay field enable insertion of NOOPs following each write or read operation. For example, it was desired to have the controller 410 to allow 3 cycles between each write operation. Then, the write delay field is set to the binary value 11. Moreover, the binary value 00 will be the default mode of operation, i.e., an operation for every cycle. A cycle is added by the controller 410 if and only if the field is set to a decimal value greater than 0.

With the mode field, the march test components include a Wd operation, a Rdb Wd operation, a Rdb Rdb Rdb Rdb operation, a Rdb operation, a Rdb Wd Rd Wbd operation, a Rdb Wd Wdb operation, a Rdb Wd Wdb Wd operation and a Rdb Wd Rd operation With the Wd operation, a write is performed using the logic value specified in the data polarity field to each memory index operation. With the Rdb Wd operation, a read from the memory under test is performed expecting a value of not (data polarity) and write logic value specified in the data polarity field to each memory index. With the Rdb Rdb Rdb Rdb operation, a hammer read (i.e., multiple reads (e.g., four) back to back) is performed from each index of the memory under test expecting a value of not (data polarity). With the Rdb operation, a single read from each index in the memory under test is performed expecting a value of not (data polarity). With the Rdb Wd Rd Wdb operation, a read is performed expecting a value specified by not (data polarity), a write is performed with a value specified by the data polarity, a read is performed expecting the value specified by the data polarity and a write is performed with a value of not (data polarity) to each index of the memory under test. With the Rdb Wd Wdb operation, a read is performed expecting the value specified by not (data polarity), a write is performed with a value specified by the data polarity and a write is performed with a value of not (data polarity) for each index of the memory under test. With the Rdb Wd Wdb Wd operation, a read is performed expecting the value specified by not (data polarity), a write is performed with a value specified by the data polarity, a write is performed with a value of not (data polarity) and a write is performed with a value specified by the data polarity to each index of the memory under test. For the Rdb Wd Rd operation, a read is performed expecting a value specified by not (data polarity), a write is performed with the value specified by the data polarity and a read is performed expecting the value specified by data polarity for each index of the memory under test.

The address order field selects the order the address space of the memory is traversed.

The diagnostics mode field activates the diagnostics capability for the instruction being executed. The delay requested field specifies in the memory must be left idle for an amount of time. The address order field specifies the address order of the test. The data polarity and reserved bit fields could be combined to realize blanket 0/1, stripe row, stripe column and checker board test patterns. The valid instruction field specifies whether the executing instructions is the last instruction to be executed.

Figure 7:
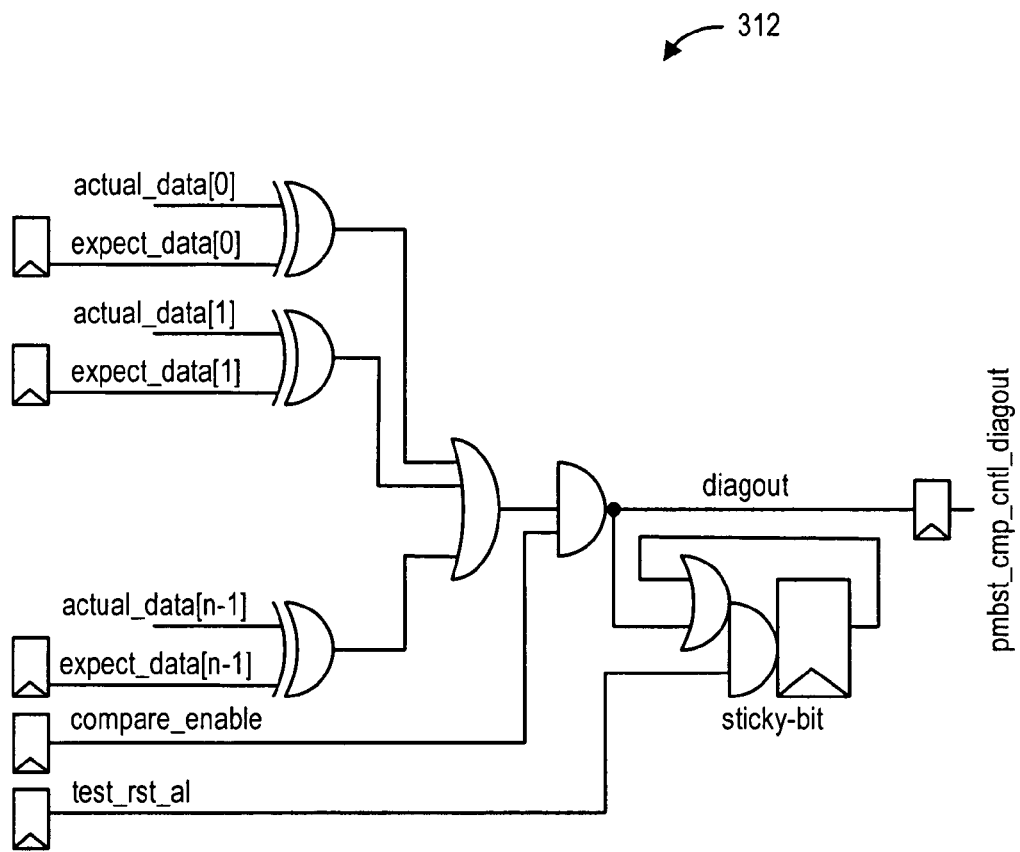
FIG. 7 shows a block diagram of a programmable memory BIST compare module.

Referring to FIG. 7, a block diagram of one example of a programmable memory BIST compare module 312 is shown. The compare module 312 includes an XOR tree that compares the actual and expected results, a compression OR gate, a compare enable gate and a pass/fail sticky bit circuit. The actual data from the compare module 312 are the data output of the memory and the expected data are generated from the controller 310 based on what the memory has been initialized with during the previous write operation.

A sticky bit circuit is also added to the compare function that is only reset via a test reset signal. Therefore, once a failure in the memory is detected the failure can be read later via a scan operation. Furthermore, a compare enable signal synchronizes the events and avoids the output of the compare module to detect a false error.

For most practical applications, one compare module is needed for each independent memory under test within a unit. However, for memories within a unit that are tested separately, one compare module is sufficient.

Figure 8:
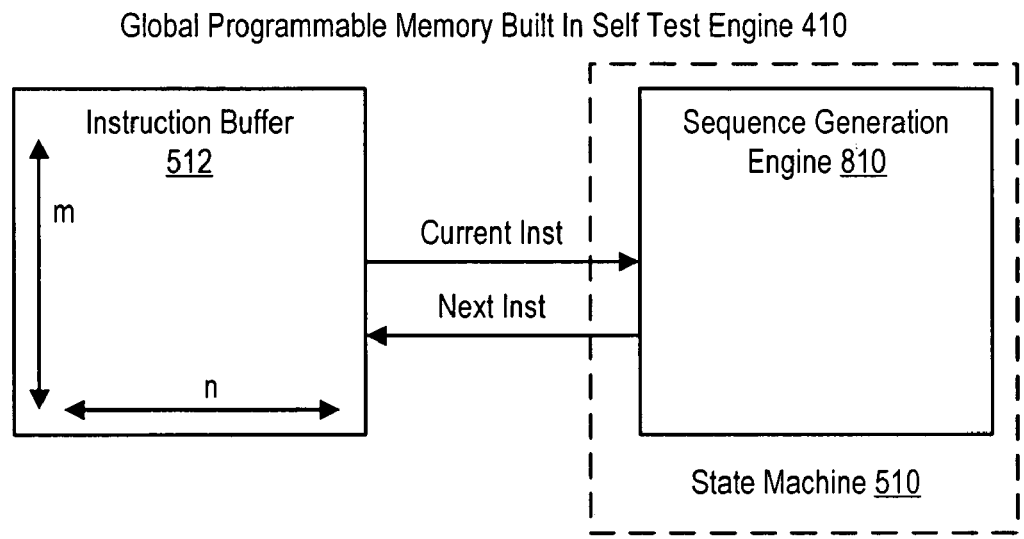
FIG. 8 shows a block diagram of a programmable memory built in self test engine.

Referring to FIG. 8, the global programmable memory BIST engine 410 includes an instruction buffer 512 as well as the state machine 510. The state machine 512 includes a sequence generation engine 810. The instruction buffer 512 includes a two dimensional (n by m) circular buffer that is realized with scannable elements. The scannable elements include the ability to reset themselves to a prespecified march test algorithm. Each instruction includes nine fields (See e.g., FIG. 6). The mode field selects the march test component. There are eight march test components that could be used to create a wide variety of march test algorithms. However, it will be appreciated that more test components could be realized with additional overhead to the sequence generation engine.

Figure 9:
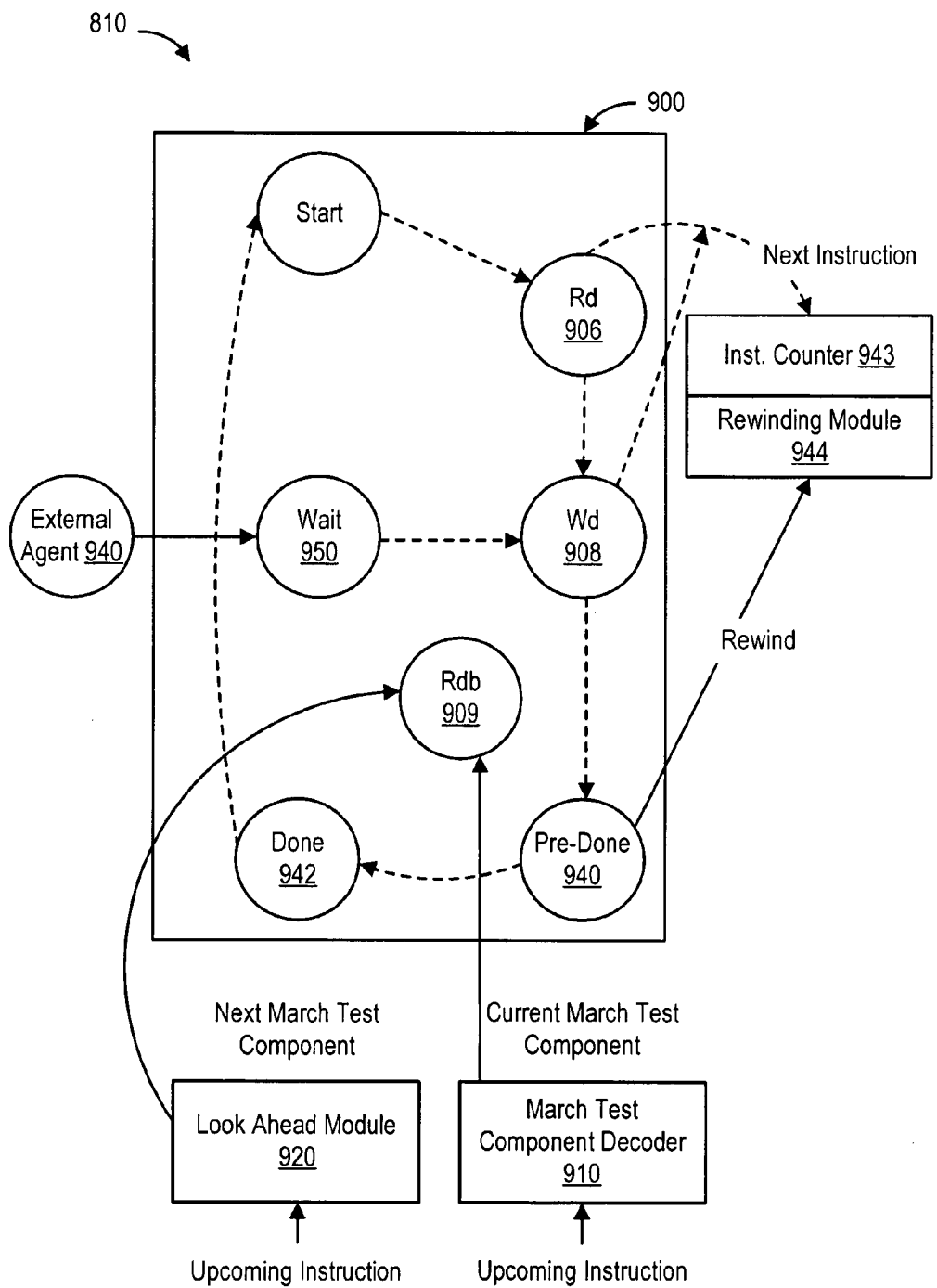
FIG. 9 shows a block diagram of a state machine of a programmable memory built in self test engine.

The instruction buffer 512 provides the current instruction to the sequence generation engine 810 and the sequence generation engine 810 issues the command to fetch the next instruction once the current instruction has been executed successfully Referring to FIG. 9, the sequence generation engine 810 includes a finite state machine 900 that can realize a specified march test component test. The state machine 900 includes a read operation state 906 and a write operation state 908 that perform read or write operations of test data polarity of data (test d) as well as a read data bar state 909 that tests the data polarity of a test data bar (test db).

The transition from one state to the next is determined by the march test component decoder 910. Also, the sequence generation engine 810 uses a look ahead module 920 to realize a true at speed test. More specifically, when a march test component is executed, the sequence generation engine 810 requests the next instruction causing the instruction buffer 512 to shift the instruction that is held in position 1 of the instruction buffer 512 forward into position 0 of the instruction buffer 512. When the instruction is shifted to position 0, the test component decoder 910 decodes the mode field within the instruction buffer 512 to determine which operation to execute for the instruction that was shifted into position 0. Thus the next state of the sequence generation engine 810 is determined.

Because it is desirable for the memory BIST engine 212 to run faster than the memory under test, the described sequence of events cannot be done in one clock cycle. Hence, a delay or a NOOP cycle would occur between execution of the march test components. However, by providing the sequence generation engine 810 with a look ahead module 920, the mode field of the instruction in position 1 is decoded and the next state of the sequence generation engine 810 is computed while the instruction 0 is being executed. As a result, as soon as the sequence generation engine 810 requests the new instruction (i.e., shifts the next instruction from position 1 of the instruction buffer to position 0 of the instruction buffer), the state of the new instruction is already available. This eliminates the need for a NOOP between execution of march test components and allows the realization of a true at speed march test. Thus, the memory under test does not see any NOOP between executing read and write operations.

Additionally, the sequence generation engine 810 includes a pre-done state 940 and a done state 942. The pre-done state 940 uses the information in an instruction counter 943 to rewind the instruction buffer 512 to the initial state of the instruction buffer 512 via the rewinding module 944. The rewind feature allows the programmable memory BIST engine 212 to be programmed once and then re-used over and over again. The done state 942 indicates that all instructions have been executed. The sequence generation engine 810 also includes a wait state 950. The wait state 950 suspends execution of the next instruction and allows the memory test to resume via a handshaking from an external agent 940. This wait state function is optionally activated and does not necessarily alter the behavior of the memory test by default.

OTHER EMBODIMENTS

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, while a particular processor architecture is set forth, it will be appreciated that variations within the processor architecture are within the scope of the present invention.

Also for example, the above-discussed embodiments include modules and units that perform certain tasks. The modules and units discussed herein may include hardware modules or software modules. The hardware modules may be implemented within custom circuitry or via some form of programmable logic device. The software modules may include script, batch, or other executable files. The modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules and units is for illustrative purposes. Alternative embodiments may merge the functionality of multiple modules or units into a single module or unit or may impose an alternate decomposition of functionality of modules or units. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method of testing an embedded memory at speed within an integrated circuit comprising:
   providing a memory built in self test sequencer module;
   providing a satellite engine module coupled to the memory built in self test sequencer module, the satellite engine module including an instruction buffer and a sequence generation engine, the sequence generation engine includes a look ahead module, the look ahead module determining a mode of operation of a next instruction while a present instruction is executing by the sequence generation engine;
   applying a march test to the embedded memory via the satellite engine module based upon information stored within the instruction buffer.

2. The method of claim 1 wherein the sequence generation engine includes a state machine, the state machine executing components of the march test.

3. The method of claim 1 wherein the sequence generation engine includes a rewind module, the rewind module rewinding the instruction buffer to an initial state.

4. The method of claim 1 wherein the instruction buffer initializes the sequence generation engine to an initial march test.

5. A programmable memory built in self test apparatus for testing an embedded memory at speed within an integrated circuit comprising:
   a memory built in self test sequencer module;
   a satellite engine module coupled to the memory built in self test sequencer module, the satellite engine module including an instruction buffer and a sequence generation engine, the sequence generation engine includes a look ahead module, the look ahead module determining a mode of operation of a next instruction while a present instruction is executing by the sequence generation engine, the satellite engine module applying a march test to the embedded memory based upon information stored within the instruction buffer.

6. The programmable memory built in self test apparatus of claim 5 wherein the sequence generation engine includes a state machine, the state machine executing components of the march test.

7. The programmable memory built in self test apparatus of claim 5 wherein the sequence generation engine includes a rewind module, the rewind module rewinding the instruction buffer to an initial state.

8. The programmable memory built in self test apparatus of claim 5 wherein the instruction buffer initializes the sequence generation engine to an initial march test.

9. A programmable memory built in self test apparatus for testing a plurality of embedded memories at speed within an integrated circuit comprising:
   a memory built in self test sequencer module;
   a plurality of satellite engine modules coupled to the memory built in self test sequencer module and to the plurality of embedded memories, each of the plurality of satellite engine modules including an instruction buffer and a sequence generation engine, the sequence generation engine includes a look ahead module, the look ahead module determining a mode of operation of a next instruction while a present instruction is executing by the sequence generation engine each of the plurality of satellite engine modules applying a march test to a respective embedded memory based upon information stored within the respective instruction buffer.

10. The programmable memory built in self test apparatus of claim 9 wherein the sequence generation engine includes a state machine, the state machine executing components of the march test.

11. The programmable memory built in self test apparatus of claim 9 wherein the sequence generation engine includes a rewind module, the rewind module rewinding the instruction buffer to an initial state.

12. The programmable memory built in self test apparatus of claim 9 wherein the instruction buffer initializes the sequence generation engine to an initial march test.

13. A processor comprising:
   a plurality of functional units, each of the functional units including a respective embedded memory;
   a programmable memory built in self test module for testing the respective embedded memory, the programmable built in self test module including a memory built in self test sequencer module;
   a plurality of satellite engine modules coupled to the memory built in self test sequencer module and to a respective embedded memory, each of the plurality of satellite engine modules including an instruction buffer and a sequence generation engine, the sequence generation engine includes a look ahead module, the look ahead module determining a mode of operation of a next instruction while a present instruction is executing by the sequence generation engine, each of the plurality of satellite engine modules applying a march test to the respective embedded memory based upon information stored within the instruction buffer.

14. The processor of claim 13 wherein the sequence generation engine includes a state machine, the state machine executing components of the march test.

15. The processor of claim 13 wherein the sequence generation engine includes a rewind module, the rewind module rewinding the instruction buffer to an initial state.

16. The processor of claim 13 wherein the instruction buffer initializes the sequence generation engine to an initial march test.

* * * * *